(12) United States Patent
Hayashi et al.

(10) Patent No.: US 11,380,526 B2
(45) Date of Patent: Jul. 5, 2022

(54) STAGE AND PLASMA PROCESSING APPARATUS

(71) Applicant: Tokyo Electron Limited, Tokyo (JP)

(72) Inventors: Daisuke Hayashi, Miyagi (JP); Tomoyuki Takahashi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 313 days.

(21) Appl. No.: 16/644,632

(22) PCT Filed: Jun. 3, 2019

(86) PCT No.: PCT/JP2019/021985
§ 371 (c)(1),
(2) Date: Mar. 5, 2020

(87) PCT Pub. No.: WO2019/239939
PCT Pub. Date: Dec. 19, 2019

(65) Prior Publication Data
US 2021/0066049 A1 Mar. 4, 2021

(30) Foreign Application Priority Data

Jun. 15, 2018 (JP) .............................. JP2018-114194

(51) Int. Cl.
*H01J 37/32* (2006.01)
*H01L 21/687* (2006.01)

(52) U.S. Cl.
CPC .. *H01J 37/32642* (2013.01); *H01L 21/68757* (2013.01); *H01J 2237/2007* (2013.01)

(58) Field of Classification Search
CPC ........... H01J 37/32642; H01J 37/32697; H01J 37/32715; H01J 37/32743; H01J 37/32449; H01J 2237/394; H01J 2237/2007; H01L 21/68757; H01L 21/68764; H01L 21/3065; H01L 21/67109; H01L 21/673; H01L 21/67306; H01L 21/67309; H01L 21/6831;
(Continued)

(56) References Cited

U.S. PATENT DOCUMENTS 9,427,913 B2 * 8/2016 Kitabata ........... H01L 21/67092
2008/0236749 A1 * 10/2008 Koshimizu ....... H01J 37/32348
156/345.33
(Continued)

FOREIGN PATENT DOCUMENTS

JP 2007-266342 A 10/2007
JP 2008-244274 A 10/2008
(Continued)

OTHER PUBLICATIONS

International Search Report dated Jul. 16, 2019 for WO 2019/239939 A1.

*Primary Examiner* — Haissa Philogene
(74) *Attorney, Agent, or Firm* — Venjuris, P.C.

(57) ABSTRACT

A stage on which a substrate is disposed includes: a base embedded with an adsorption electrode therein; a focus ring provided above the adsorption electrode and adsorbed and held on the base; and a deposit control ring provided radially inside the focus ring on the base. A gap is formed between the focus ring and the deposit control ring in a radial direction to separate the focus ring and the deposit control ring.

17 Claims, 5 Drawing Sheets

(58) Field of Classification Search
CPC . H01L 21/68785; C23C 14/50; C23C 16/458; Y10S 156/915; Y10S 156/916
See application file for complete search history.

(56) References Cited

U.S. PATENT DOCUMENTS

2017/0066103 A1* 3/2017 Tomioka ................. B24B 37/32
2019/0019716 A1* 1/2019 Sasaki ............... H01L 21/67109

FOREIGN PATENT DOCUMENTS

| | | |
|---|---|---|
| JP | 2011-192661 A | 9/2011 |
| JP | 2017-002385 A | 1/2017 |
| JP | 2017-055100 A | 3/2017 |
| JP | 2017-092448 A | 5/2017 |

* cited by examiner

US 11,380,526 B2

STAGE AND PLASMA PROCESSING APPARATUS

CROSS REFERENCE TO RELATED APPLICATIONS

This application is a national phase of PCT application No. PCT/JP2019/021985, filed on 3 Jun. 2019, which claims priority from Japanese Patent Application No. 2018-114194, filed on 15 Jun. 2018, all of which are incorporated herein by reference.

TECHNICAL FIELD

The present invention relates to a stage and a plasma processing apparatus.

BACKGROUND

Patent Document 1 discloses a stage including a metal member and a ceramic plate in which an electrode for an electrostatic chuck is embedded inside a plasma processing apparatus. The ceramic plate is provided to be stacked on the metal member, and a groove for forming a coolant flow path is formed on at least one of the lower surface of the ceramic plate and the upper surface of the metal member. Further, electrodes for the electrostatic chuck are provided to be capable of electrostatically adsorbing a focus ring arranged to surround a substrate to be processed, and the temperature of the focus ring is kept low.

PRIOR ART DOCUMENT

Patent Document

Patent Document 1: Japanese Patent Laid-Open Publication No. 2007-266342

SUMMARY OF THE INVENTION

Problems to be Solved

According to the technology of the present disclosure, in a stage on which a substrate is disposed, adhesion of reaction by-products (deposits) to peripheral portions of a side wall of the stage (including an inner periphery of the focus ring) is reduced while appropriately controlling the temperature of a focus ring.

Means to Solve the Problems

An embodiment of the present disclosure relates to a stage on which a substrate is disposed. The stage includes: a base including an adsorption electrode therein; a focus ring provided above the adsorption electrode and sucked and held on the base; and a deposit control ring radially inside the focus ring provided on the base. A gap is formed between the focus ring and the deposit control ring in the radial direction to separate the focus ring and the deposit control ring.

Effect of the Invention

According to the present disclosure, it is possible to reduce adhesion of deposits on the peripheral portions of the side wall of the stage while appropriately controlling the temperature of the focus ring on the stage on which the substrate is disposed.

DETAILED DESCRIPTION TO EXECUTE THE INVENTION

Figure 1:
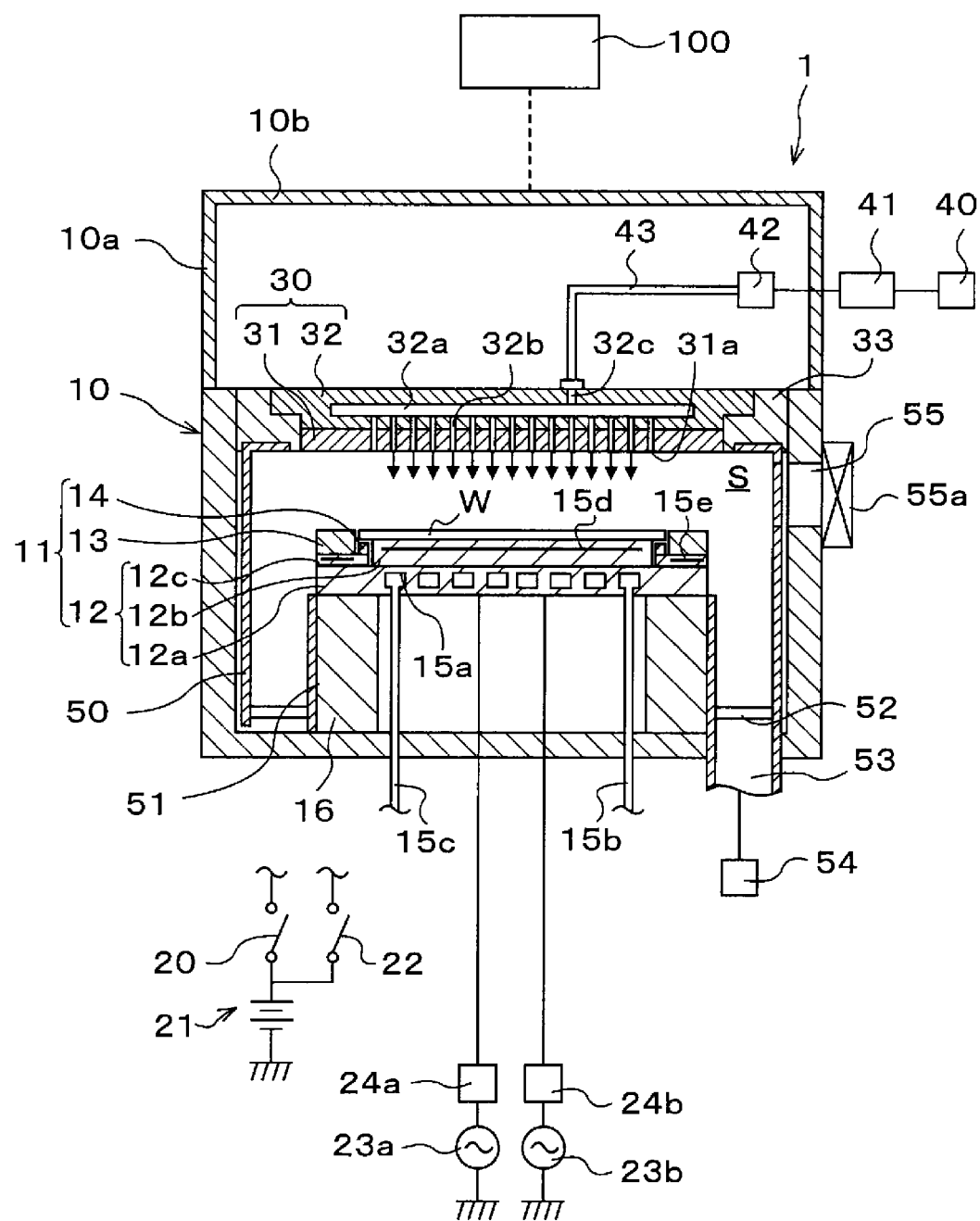
FIG. 1 is a longitudinal sectional view schematically illustrating the outline of the configuration of a plasma processing apparatus according to the present embodiment.

First, a plasma processing apparatus and a stage of the related art will be described based on the configuration described in Patent Document 1.

In a semiconductor device manufacturing process, a plasma processing apparatus generates plasma by exciting a processing gas, and processes a substrate to be processed (hereinafter, referred to as a "substrate") such as a semiconductor wafer by the plasma. Such a plasma processing apparatus is provided with a stage having a substrate mounting surface. As described in Patent Document 1, the substrate mounted on the stage is heated to a high temperature by being exposed to plasma, but is adjusted to a predetermined process temperature, for example, about 30° C. to 50° C., through a ceramic plate by a coolant flowing through a coolant flow path.

Here, a focus ring arranged to surround a substrate disposed on the stage described in Patent Document 1 is electrostatically adsorbed to the stage. The focus ring is heated to a high temperature (e.g., about 300° C. depending on conditions) by being exposed to plasma similarly to the substrate. Meanwhile, in order to avoid thermal effects on the substrate adjusted to a predetermined process temperature, for example, the influence on the etchant distribution control and the distribution control of the Si scavenging function, the focus ring may be cooled and used similarly to the substrate.

Further, in the plasma processing, exposure of a member surface to plasma may cause reaction by-products (deposits) to adhere to the surface. When a deposit adheres to the inner peripheral portion of the focus ring due to the wraparound of the plasma, the deposit may easily adhere to a substrate bevel portion or the side wall of the stage due to the detachment of the deposit, which may cause particles.

Therefore, in order to suppress such adhesion, it is necessary to increase the temperature of the inner peripheral portion of the focus ring.

When the focus ring is cooled, the vicinity of the surface of the focus ring may be cooled in order to suppress a thermal influence on a substrate to be cooled. However, the inner peripheral portion of the focus ring is also cooled at the same time, and a deposit is attached thereto. That is, the focus ring is configured such that the inner peripheral portion to be heated and the vicinity of the surface to be cooled are integrated. Therefore, it has been difficult to appropriately control the temperature of the focus ring.

Therefore, the technology according to the present disclosure controls the temperature of the focus ring electrostatically adsorbed on the stage. Specifically, in the focus ring, a portion to be cooled and a portion to be heated are separated from each other. Hereinafter, the portion to be heated is referred to as a deposit control ring. Then, the temperatures of the focus ring and the deposit control ring are controlled independently of each other. With this configuration, a stage that may perform an appropriate temperature control may be implemented.

Hereinafter, the configuration of a stage and a plasma processing apparatus including the stage according to the present embodiment will be described with reference to the drawings. Also, in the present specification and drawings, components having substantially the same functional configurations will be denoted by the same symbols, and the descriptions thereof will be omitted.

Plasma Processing Apparatus

FIG. 1 is a longitudinal sectional view schematically illustrating the outline of the configuration of a plasma processing apparatus 1 according to the present embodiment. In the present embodiment, a capacitively coupled parallel plate plasma etching apparatus will be described as an example of the plasma processing apparatus 1.

As illustrated in FIG. 1, the plasma processing apparatus 1 has a processing container 10 having a substantially cylindrical shape. The processing container 10 is made of, for example, aluminum, and the surface thereof is subjected to an anode oxidation processing. The processing container 10 defines a processing space S in which plasma is generated.

A stage 11 on which a wafer W acting as a substrate is disposed is accommodated in the processing container 10. The stage 11 has a base 12, a focus ring 13, and a deposit control ring 14. The focus ring 13 and the deposit control ring 14 are provided on the base 12.

The base 12 has a base body 12a, a wafer holder 12b as a substrate holder provided on the base body 12a, and a ring holder 12c provided on the base body 12a. The base body 12a has a substantially disk shape, and has a diameter larger than the diameter of the wafer W. The diameter of the wafer W is about 300 mm. The wafer holder 12b has a substantially disk shape with a smaller diameter than the base body 12a and is provided coaxially with the base body 12a. The ring holder 12c has a substantially annular shape and is provided radially outward to surround the wafer holder 12b in plan view. The inner diameter of the ring holder 12c is larger than the outer diameter of the wafer holder 12b. Further, the upper surface of the wafer holder 12b is located above the upper surface of the ring holder 12c in side view.

A coolant flow path 15a is formed inside the base body 20. A coolant is supplied to a coolant flow path 15a from a chiller unit (not illustrated) provided outside the processing container 10 via a coolant inlet pipe 15b. The coolant supplied to the coolant flow path 15a is configured to return to the chiller unit via a coolant outlet flow path 15c. By circulating a coolant, for example, cooling water, in the coolant flow path 15a, the wafer W disposed on the wafer holder 12b, the focus ring 13 held on the ring holder 12c, and the stage 11 may be cooled to a predetermined temperature, for example, 30° C. to 50° C. Further, the base body 12a is made of a conductive metal, for example, aluminum or the like, and has a function as a lower electrode.

The wafer holder 12b is made of, for example, ceramic, and has a first adsorption electrode 15d provided therein. A DC power supply 21 is connected to the first adsorption electrode 15d via a switch 20. Then, the wafer holder 12b may attract and hold the wafer W on the mounting surface by electrostatic force generated by applying a DC voltage from the DC power supply 21 to the first adsorption electrode 15d. That is, the wafer holder 12b has a function as an electrostatic chuck for the wafer W.

The ring holder 12c is made of, for example, ceramic, and has a second adsorption electrode 15e provided therein. A DC power supply 21 is connected to the second adsorption electrode 15e via a switch 22. Then, the ring holder 12c may attract and hold the focus ring 13 on the holding surface by electrostatic force generated by applying a DC voltage from the DC power supply 21 to the second adsorption electrode 15e. That is, the ring holder 12c has a function as an electrostatic chuck for the focus ring 13.

The DC power supply for applying a DC voltage to the second adsorption electrode 15e may be provided separately from the DC power supply 21 for applying a DC voltage to the first adsorption electrode 15d.

An annular focus ring 13 is adsorbed and held by the second adsorption electrode 15e on the upper surface of the ring holder 12c. The focus ring 13 is held coaxially with the wafer holder 12b through the wafer W placed on the wafer holder 12b in plan view. The focus ring 13 is provided to improve the uniformity of the plasma processing. For this reason, the focus ring 13 is made of the same type of material as the wafer W placed on the wafer holder 12b, for example, silicon (Si) constituting the wafer W in the present embodiment.

The focus ring 13 is adsorbed and held on the upper surface of the ring holder 12c by the electrostatic force as described above. At this time, the focus ring 13 is cooled by the coolant flowing through the coolant flow path 15a formed inside the base body 12a via the ring holder 12c. As described above, the focus ring 13 is configured to be cooled by being electrostatically adsorbed to the ring holder 12c.

A deposit control ring 14 is provided radially inside the focus ring 13 and on the upper surface of the ring holder 12c. The deposit control ring 14 is provided to be coaxial with the wafer holder 12b. Further, the deposit control ring 14 is provided below the wafer W placed on the wafer holder 12b, on the inner peripheral portion of the deposit control ring 14, and on the side wall of the wafer holder 12b in order to suppress adhesion of the deposit. The deposit control ring 14 is arranged to be separated from the focus ring 13, and is configured to be able to raise the temperature independently of the focus ring 13.

Specifically, the deposit control ring 14 is heated by being exposed to plasma. However, since the deposit control ring 14 is arranged separately from the focus ring 13, the deposit control ring 14 is not thermally affected by the focus ring 13. Further, since the electrostatic adsorption is not performed by the second adsorption electrode 15e, heat transfer from the ring holder 12c to the deposit control ring 14 is suppressed. Therefore, the deposit control ring 14 is maintained at a high temperature with respect to the inner peripheral portion of the focus ring 13 during plasma generation.

In the present embodiment, the deposit control ring 14 is made of, for example, the same type of material as the focus ring 13, that is, silicon (Si).

A first RF power supply 23*a* and a second RF power supply 23*b* are configured to be connected to the base body 12*a* of the base 12 via a first matching device 24*a* and a second matching device 24*b*, respectively, and applicable to the stage 11.

The first RF power supply 23*a* is a power supply that generates radio frequency power for plasma generation. The frequency may be 27 MHz to 100 MHz from the first RF power supply 23*a*, and in an example, radio frequency power of 40 MHz is supplied to the base body 12*a* of the stage 11. The first matching device 24*a* has a circuit that matches the output impedance of the first RF power supply 23*a* with the input impedance on the load side (the base body 12*a* side).

The second RF power supply 23*b* generates radio frequency power for drawing ions into the wafer W (radio frequency bias power) and supplies the radio frequency bias power to the base body 12*a*. The frequency of the radio frequency bias power may be the frequency within a range of 400 kHz to 13.56 MHz, and is 3 MHz in an example. The second matching device 24*b* has a circuit that matches the output impedance of the second RF power supply 23*b* with the input impedance on the load side (the base body 12*a* side).

The stage 11 configured as described above is fastened to a substantially cylindrical support member 16 provided at the bottom of the processing container 10. The support member 16 is made of, for example, an insulator such as a ceramic.

A shower head 30 is provided above the stage 11 to face the stage 11. The shower head 30 has a function as an upper electrode, and has an electrode plate 31 arranged facing the processing space S, and an electrode support 32 provided above the electrode plate 31. The electrode plate 31 functions as the base body 12*a* and a pair of electrodes (an upper electrode and a lower electrode). The shower head 30 is supported on an upper portion of the processing container 10 via an insulating shielding member 33.

The electrode plate 31 is formed with a plurality of gas outlets 31*a* that supplies a processing gas sent from a gas diffusion chamber 32*a* (to be described later) to the processing space S. The electrode plate 31 is made of, for example, a conductor or a semiconductor having a low electric resistivity with little generated Joule heat.

The electrode support 32 detachably supports the electrode plate 31 and is made of, for example, a conductive material such as aluminum whose surface is anodized. The gas diffusion chamber 32*a* is provided inside the electrode support 32. A plurality of gas flow holes 32*b* communicating with the gas outlets 31*a* is formed from the gas diffusion chamber 32*a*. Further, a gas supply source group 40 that supplies a processing gas to the gas diffusion chamber 32*a* is connected to the electrode support 32 via a flow rate control device group 41, a valve group 42, a gas supply pipe 43, and a gas introduction hole 32*c*.

The gas supply source group 40 has a plurality of types of gas supply sources necessary for the plasma processing. In the plasma processing apparatus 1, a processing gas from one or more gas supply sources selected from the gas supply source group 40 is supplied to the gas diffusion chamber 32*a* via the flow rate control device group 41, the valve group 42, the gas supply pipe 43, and the gas introduction hole 32*c*. Then, the processing gas supplied to the gas diffusion chamber 32*a* is dispersed and supplied in a shower shape into the processing space S via the gas flow holes 32*b* and the gas outlets 31*a*.

Further, the plasma processing apparatus 1 is provided with a cylindrical grounding conductor 10*a* that extends above the height position of the shower head 30 from the side wall of the processing container 10. The cylindrical grounding conductor 10*a* has a top plate 10*b* at the top.

Further, in the plasma processing apparatus 1, a deposit shield 50 is detachably provided along the inner wall of the processing container 10. The deposit shield 50 serves to suppress a deposit from being attached to the inner wall of the processing container 10 and is formed by coating a ceramic such as $Y_2O_3$ on an aluminum material. Similarly, a deposit shield 51 is detachably provided on the surface facing the deposit shield 50 and on the outer peripheral surface of the support member 16.

An exhaust plate 52 is provided at the bottom of the processing container 10 and between the inner wall of the processing container 10 and the support member 16. The exhaust plate 52 is formed by coating a ceramic such as $Y_2O_3$ on an aluminum material. The processing space S communicates with an exhaust port 53 via the exhaust plate 52. An exhaust device 54 such as a vacuum pump is connected to the exhaust port 53, and the inside of the processing space S may be depressurized by the exhaust device 54.

A loading/unloading port 55 for the wafer W is formed on a side wall of the processing container 10, and the loading/unloading port 55 may be opened and closed by a gate valve 55*a*.

A controller 100 is provided in the above-described plasma processing apparatus 1. The controller 100 is, for example, a computer and has a program storage (not illustrated). A program for controlling the processing of the wafer W in the plasma processing apparatus 1 is stored in the program storage. Further, the program storage stores a control program for controlling various processes by a processor and a program for causing each component of the plasma processing apparatus 1 to execute a process according to a processing condition, that is, a process recipe. The program may be recorded in a computer-readable storage medium and installed from the storage medium to the controller 100.

First Embodiment

Figure 2:
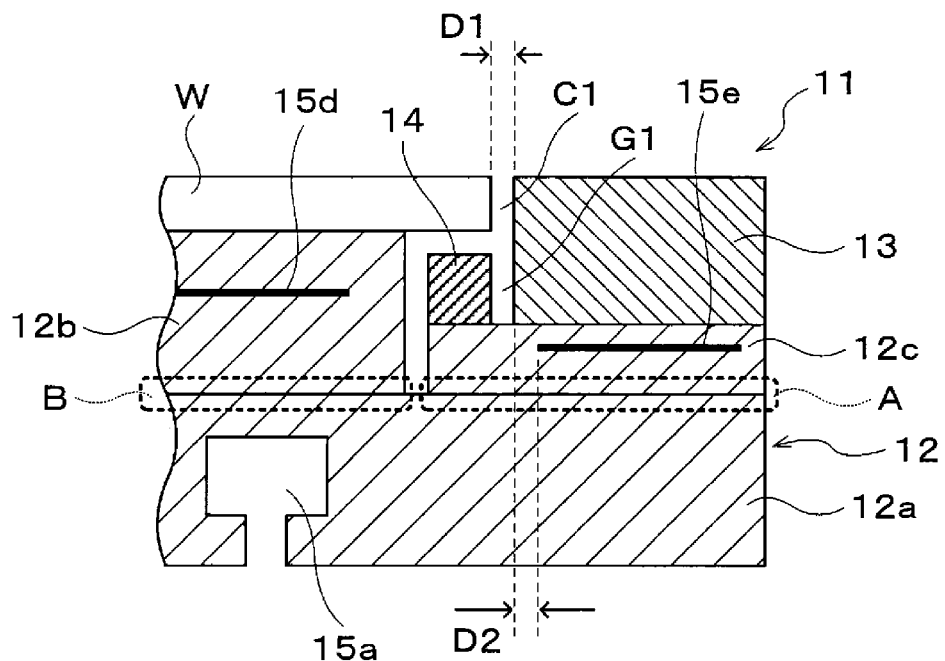
FIG. 2 is an enlarged view of a main part schematically illustrating the outline of the configuration of a stage according to a first embodiment.

Next, the stage 11 according to a first embodiment will be described with reference to FIG. 2. FIG. 2 is an enlarged view of a main part schematically illustrating the outline of the configuration of the stage 11 according to the first embodiment.

As described above, the stage 11 has the base 12, the focus ring 13, and the deposit control ring 14. Further, the base 12 includes a wafer holder 12*b* which disposes the wafer W by electrostatic adsorption, a ring holder 12*c* which holds the focus ring 13 and the deposit control ring 14, and a base body 12*a* which has the wafer holder 12*b* and the ring holder 12*c* on the upper surface. The base body 12*a* has a substantially disk shape. The wafer holder 12*b* has a substantially disk shape and is fixed above the base body 12*a* via, for example, an adhesive to be coaxial with the base body 12*a*. The ring holder 12*c* has a substantially annular shape and is fixed to the outside in the radial direction via, for example, an adhesive to surround the base body 12*a*. As described above, the wafer holder 12b is provided such that the upper surface of the wafer holder 12b is located higher than the upper surface of the ring holder 12c in side view.

The coolant flow path 15a is formed inside the base body 12a and below the wafer holder 12b.

The first adsorption electrode 15d for adsorbing the wafer W is provided inside the wafer holder 12b and above the coolant flow path 15a. As described above, the wafer holder 12b may attract the wafer W to the mounting surface by the electrostatic force generated when a DC voltage is applied to the first adsorption electrode 15d.

A second adsorption electrode 15e for adsorbing the focus ring 13 is provided inside the ring holder 12c. As described above, the wafer holder 12c may attract the focus ring 13 by the electrostatic force generated when a DC voltage is applied to the second adsorption electrode 15e.

The focus ring 13 has an annular structure having a substantially rectangular cross section and is provided to surround the wafer W mounted on the wafer holder 12b. Specifically, the inner diameter of the focus ring 13 is larger than the outer diameter of the wafer W, and a clearance C1 is provided. In the present embodiment, an interval D1 of the clearance C1 is preferably, for example, larger than 0 mm and equal to or less than 1 mm. Further, the upper surface of the focus ring 13 is configured to substantially coincide with the upper surface of the wafer W placed on the wafer holder 12b.

The inner diameter of the focus ring 13 is smaller than the inner diameter of the second adsorption electrode 15e. This is to prevent the deposit control ring 14 from being electrostatically adsorbed by the second adsorption electrode 15e as described later. In other words, the deposit control ring 14 may be disposed at a position that does not overlap with the second adsorption electrode 15e in plan view. In the present embodiment, a difference D2 between the inner diameter of the second adsorption electrode 15e and the inner diameter of the focus ring 13 is preferably larger than 0 mm and equal to or less than 10 mm. The second adsorption electrode 15e may be a ring-shaped electrode or a bipolar electrode in which a ring is divided into a plurality in the circumferential direction.

Further, in order to increase the cooling efficiency of the focus ring 13 by electrostatic adsorption, a contact area A between the focus ring 13 and the ring holder 12c is preferably subjected to a surface treatment to reduce the contact thermal resistance. Specific surface treatment includes, for example, treatment such as polishing.

A deposit control ring 14 is provided on the upper surface of the ring holder 12c, radially inside the focus ring 13 and below the wafer W placed on the wafer holder 12b. The deposit control ring 14 is fixed to the ring holder 12c via, for example, an adhesive. Further, the deposit control ring 14 has an annular structure having a substantially rectangular cross section.

In addition, as described above, the deposit control ring 14 is configured to be separated from the focus ring 13 in the present embodiment. Specifically, a gap G1 is formed between the focus ring 13 and the deposit control ring 14 in the radial direction. The gap G1 extends in the vertical direction. The focus ring 13 and the deposit control ring 14 are separated from each other by the gap G1 and are not in contact with each other.

In addition, in order to prevent the deposit control ring 14 from being cooled by the heat transfer from the ring holder 12c, a contact area B between the deposit control ring 14 and the ring holder 12c is preferably subjected to a surface treatment to increase the contact thermal resistance. Specifically, the lower surface of the deposit control ring 14 and/or the upper surface of the ring holder 12c are subjected to a surface treatment to increase the surface roughness. Then, the lower surface of the deposit control ring 14 and/or the upper surface of the ring holder 12c are roughened. Thus, the contact thermal resistance in the contact area B between the deposit control ring 14 and the ring holder 12c is configured to become relatively larger than the contact thermal resistance in the contact area A between the focus ring 13 and the ring holder 12c.

As described above, in the present embodiment, the focus ring 13 and the deposit control ring 14 are configured separately. The focus ring 13 is adsorbed and cooled by the ring holder 12c. However, even in such a case, the temperature of the deposit control ring 14 may be kept higher than that of the inner peripheral portion of the focus ring 13. Further, as described above, the inner diameter of the second adsorption electrode 15e is formed to be larger than the inner diameter of the focus ring 13. That is, since the second adsorption electrode 15e is not laid below the deposit control ring 14, the deposit control ring 14 is not electrostatically adsorbed by the second adsorption electrode 15e and is not cooled. By keeping the temperature of the deposit control ring 14 higher than the inner peripheral portion of the focus ring 13 in this manner, it is possible to suppress the adhesion of the deposit on the deposit control ring 14 and the wafer holder 12b due to the plasma wrapping around from the outer peripheral portion of the wafer W.

In the present embodiment, the internal D1 is larger than 0 mm and equal to or less than 1 mm, and the clearance C1 between the focus ring 13 and the wafer W is configured to be slight. By setting the size of the interval D1 to be slight, it is possible to suppress the intrusion of plasma from the clearance C1. That is, the total amount of plasma wrapping around from the outer peripheral portion of the wafer W may be reduced, and the adhesion of the deposit on the deposit control ring 14 and the wafer holder 12b may be more appropriately suppressed.

In the above embodiment, in order to thermally separate the ring holder 12c and the deposit control ring 14, the lower surface of the deposit control ring 14 and/or the upper surface of the ring holder 12c are roughened to reduce the contact thermal resistance. However, when the temperature of the deposit control ring 14 may be kept high independently of the focus ring 13 and the ring holder 12c, a method of thermal separation is not limited to this. For example, a heat resistance layer having a heat insulating property may be formed between the deposit control ring 14 and the ring holder 12c. Although the heat resistance layer is not particularly limited, a heat insulating member, for example, Teflon (registered trademark) is used. Alternatively, the heat resistance layer may be formed by applying a heat insulating coating to the surface of the deposit control ring 14 and/or the ring holder 12c. As described above, by forming the heat resistance layer between the deposit control ring 14 and the ring holder 12c, heat transfer from the ring holder 12c to the deposit control ring 14 may be prevented, and the temperature of the deposit control ring 14 may be kept higher than the inner peripheral portion of the focus ring 13.

Further, in the above embodiment, the deposit control ring 14 is made of the same type of material as the focus ring 13, that is, Si, but the material of the deposit control ring 14 is not limited to this and may be arbitrarily selected. As for the material of the deposit control ring 14, a brittle material such as, for example, Si, SiC, $SiO_2$, $Si_3N_4$, $Al_2O_3$, or AlN may be used. When the deposit control ring 14 is required to have a Si scavenging function, it is selected from Si, SiC, $SiO_2$, and $Si_3N_4$. Alternatively, when only plasma resistance is required, $Al_2O_3$, AlN, or the like may be used. Further, the material of the deposit control ring 14 may be a resin material, for example, a Teflon (registered trademark) material such as PTFE, PCTFE, or PFA or an engineering plastic material such as PEEK. However, it is preferable that a material having a high thermal conductivity is selected as a material of the deposit control ring 14. When a material having a high thermal conductivity is used, the temperature of the deposit control ring 14 may be rapidly increased by plasma.

Further, the surface of the deposit control ring 14 may be subjected to a thermal spraying process, a sintering process, or a coating process. The thermal spray material may be, for example, a ceramic such as $Al_2O_3$, $Y_2O_3$, or YF. The coating method may be a diamond like carbon (DLC), an aerosol deposition, or the like.

In the above embodiment, the surface of the deposit control ring 14 and the ring holder 12c is subjected to a surface treatment, or a heat resistance layer such as a heat insulating member or a heat insulating coating is formed to thermally separate the elements. However, the surface treatment and the heat resistance layer may be omitted, and the thermal conductivity may be controlled by appropriately selecting the above-described materials to thermally separate the materials.

Figure 3:
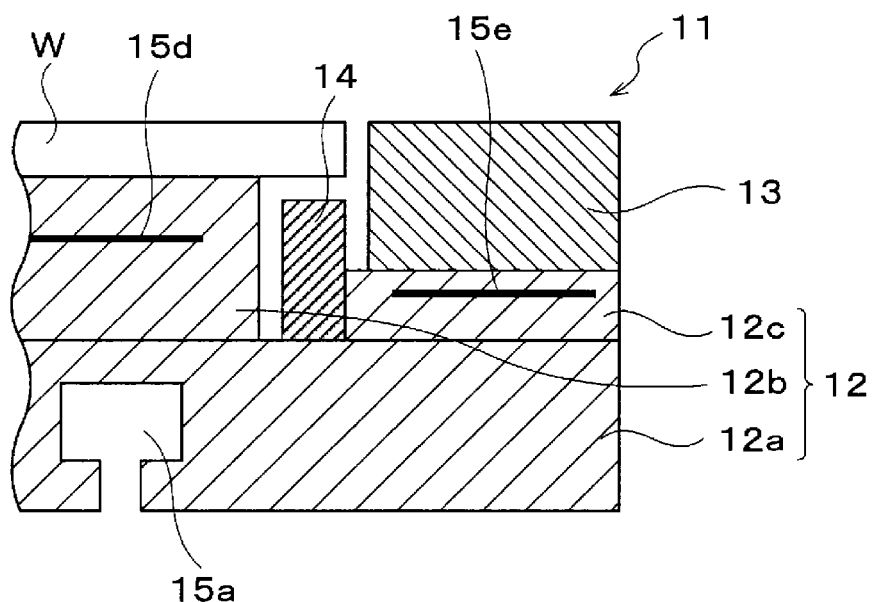
FIG. 3 is an enlarged view of a main part schematically illustrating the outline of the configuration of the stage according to the first embodiment.

In the above embodiment, the deposit control ring 14 may be extended in the vertical direction (length direction) and provided directly on the base body 12a. As illustrated in FIG. 3, the ring holder 12c may be reduced radially outward, and the deposit control ring 14 may be directly fixed to the base body 12a.

By extending the deposit control ring 14 in this manner, the component life of the deposit control ring 14 and the ring holder 12c may be extended. Further, since the deposit control ring 14 is not directly held on the upper surface of the ring holder 12c, it may be more reliably separated from the second adsorption electrode 15e inside the ring holder 12c.

When the deposit control ring 14 is directly fixed to the base body 12a as illustrated in FIG. 3, the cooling effect of a coolant flowing through the inside of the coolant flow path 15a formed inside the base body 12a is more greatly affected. In order to suppress such a cooling effect and keep the temperature of the deposit control ring 14 at a high temperature, a heat insulating member (not illustrated) as a heat insulating layer may be provided between the deposit control ring 14 and the base body 12a.

In the present embodiment, each of the wafer holder 12b and the ring holder 12c is made of ceramic and has insulating properties. However, the wafer holder 12b and the ring holder 12c are not limited to the ceramic configuration as long as the elements have insulating properties. For example, the wafer holder 12b and the ring holder 12c may be configured by applying a thermal spraying process, a sintering process, or a coating process to the surface of an aluminum material. In such a case, the thermal spray material may be a ceramic such as $Al_2O_3$, $Y_2O_3$, or YF. The coating method may be a diamond like carbon (DLC), an aerosol deposition, or the like.

As described above, in the present embodiment, the focus ring 13 and the deposit control ring 14 are separated via the gap G1. Thus, the temperature of the focus ring 13 and the temperature of the deposit control ring 14 may be controlled independently of each other, and the temperature of the deposit control ring 14 may be kept higher than the inner peripheral portion of the focus ring 13. As a result, it is possible to suppress the adhesion of the deposit on the deposit control ring 14 and the wafer holder 12b due to the plasma wrapping around from the outer peripheral portion of the wafer W.

Here, in order to perform the temperature control of the focus ring 13 and the deposit control ring 14 independently, an independent temperature control mechanism may be used. In order to suppress the adhesion of the deposit, it is necessary to raise the temperature of the deposit control ring 14 relatively than the temperature of the focus ring 13. For this reason, when the gap G1 is provided between the focus ring 13 and the deposit control ring 14 and physically separated as in the present embodiment, adhesion of the deposit may be suppressed. Therefore, the stage 11 of the present embodiment has a simple structure and is advantageous in cost.

Further, the inner diameter of the focus ring 13 is formed smaller than the inner diameter of the second adsorption electrode 15e, and the second adsorption electrode 15e is located only below the focus ring 13 and is not arranged below the deposit control ring 14. For this reason, the deposit control ring 14 is not adsorbed to the ring holder 12c, the heat transfer from the ring holder 12c to the deposit control ring 14 is suppressed, and the deposit control ring 14 may be kept at a higher temperature than the inner peripheral portion of the focus ring 13. Moreover, the difference D2 between the inner diameter of the focus ring 13 and the inner diameter of the second adsorption electrode 15e is equal to or less than 10 mm, and the function of adsorbing the focus ring 13 by the second adsorption electrode 15e may be ensured.

Further, the surface treatment is performed so that the contact thermal resistance between the deposit control ring 14 and the base 12 is larger than the contact thermal resistance between the focus ring 13 and the base 12. Alternatively, a heat resistance layer having a heat insulating property is formed between the deposit control ring 14 and the base 12. With these surface treatments and heat resistance layers, the thermal resistance between the deposit control ring 14 and the base 12 may be increased, and the temperature of the deposit control ring 14 may be kept higher than the inner peripheral portion of the focus ring 13.

Further, a clearance C1 is provided between the focus ring 13 and the wafer W, and an interval D1 of the clearance C1 is larger than 0 mm and equal to or less than 1 mm. As described above, by setting the size of the interval D1 to 1 mm or less, it is possible to suppress the intrusion of plasma from the clearance C1.

In the first embodiment, the clearance C1 between the inner diameter of the focus ring 13 and the wafer W is continuous with the gap G1 extending in the vertical direction. In such a case, although most of the plasma intrusion may be suppressed by forming the interval D1 of the clearance C1 to be 1 mm or less, a part of the plasma enters the gap G1 from the clearance C1. Then, it is considered that the plasma reaches the ring holder 12c through the clearance C1 and the gap G1, and as a result, the ring holder 12c is damaged. Therefore, the present inventors have conceived of making the gap G1 a labyrinth structure, as described in a second embodiment and a third embodiment (to be described later).

Second Embodiment

Figure 4:
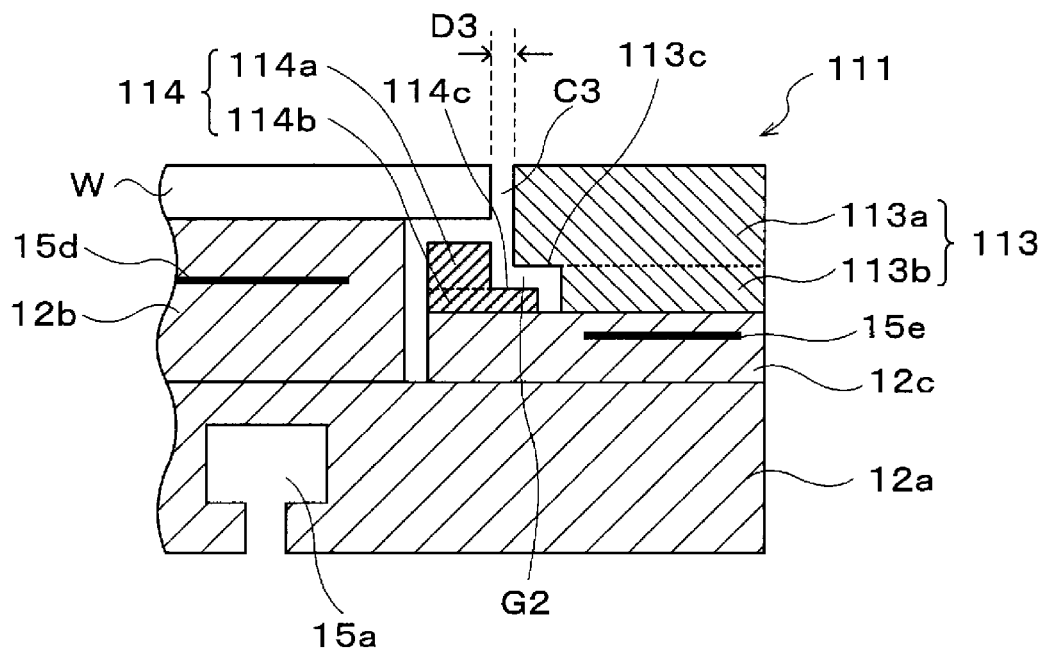
FIG. 4 is an enlarged view of a main part schematically illustrating the outline of the configuration of a stage according to a second embodiment.

Next, the configuration of a stage 111 according to a second embodiment for making it difficult for plasma to reach the ring holder 12c will be described with reference to FIG. 4. FIG. 4 is an enlarged view of a main part schematically illustrating the outline of the configuration of the stage 111 according to the second embodiment. Descriptions of substantially the same components as those of the stage 11 according to the above-described first embodiment will be omitted by assigning the same numbers or omitting the reference numerals.

The focus ring 113 according to the present embodiment has a configuration in which an upper ring portion 113a and a lower ring portion 113b are provided integrally, as illustrated in FIG. 4. The upper ring portion 113a and the lower ring portion 113b have annular shapes having different inner diameters. Specifically, the inner diameter of the upper ring portion 113a is smaller than the inner diameter of the lower ring portion 113b, and the upper ring portion 113a protrudes radially inward at the outer peripheral portion of the focus ring 113. The upper ring portion 113a and the lower ring portion 113b form an upper end portion 113c. The outer diameters of the upper ring portion 113a and the lower ring portion 113b are substantially the same. Further, the upper surface of the upper ring portion 113a is configured to substantially coincide with the upper surface of the wafer W placed on the wafer holder 12b.

The inner diameter of the upper ring portion 113a is larger than the outer diameter of the wafer W, and a clearance C3 is provided. In the present embodiment, an interval D3 of the clearance C3 is preferably, for example, larger than 0 mm and equal to or less than 1 mm.

A deposit control ring 114 is provided on the upper surface of the ring holder 12c, radially inside the focus ring 113 and below the wafer W placed on the wafer holder 12c. The deposit control ring 114 is fixed to the ring holder 12c via, for example, an adhesive.

The deposit control ring 114 has a configuration in which an upper ring portion 114a and a lower ring portion 114b are provided integrally. The upper ring portion 114a and the lower ring portion 114b have annular shapes having different inner diameters. Specifically, the inner diameter of the upper ring portion 114a is smaller than the inner diameter of the lower ring portion 114b, and the upper ring portion 113a protrudes radially inward at the outer peripheral portion of the deposit control ring 114. The upper ring portion 114a and the lower ring portion 114b form an upper end portion 114c.

A gap G2 is formed between the focus ring 113 and the deposit control ring 114 in the radial direction. The gap G2 has a labyrinth structure by the upper end portion 113c of the focus ring 113 and the lower end portion 114c of the deposit control ring 114. The gap G2 may prevent the plasma from reaching the ring holder 12c. As a result, damage to the ring holder 12c due to plasma may be suppressed.

Also, in the present embodiment, the focus ring 113 and the deposit control ring 114 are separated. Further, since an interval D3 of the clearance C3 is 1 mm or less, it is possible to appropriately suppress the adhesion of the deposit on the deposit control ring 14 and the wafer holder 12b due to the plasma wrapping around from the outer peripheral portion of the wafer W as in the first embodiment.

Third Embodiment

Figure 5:
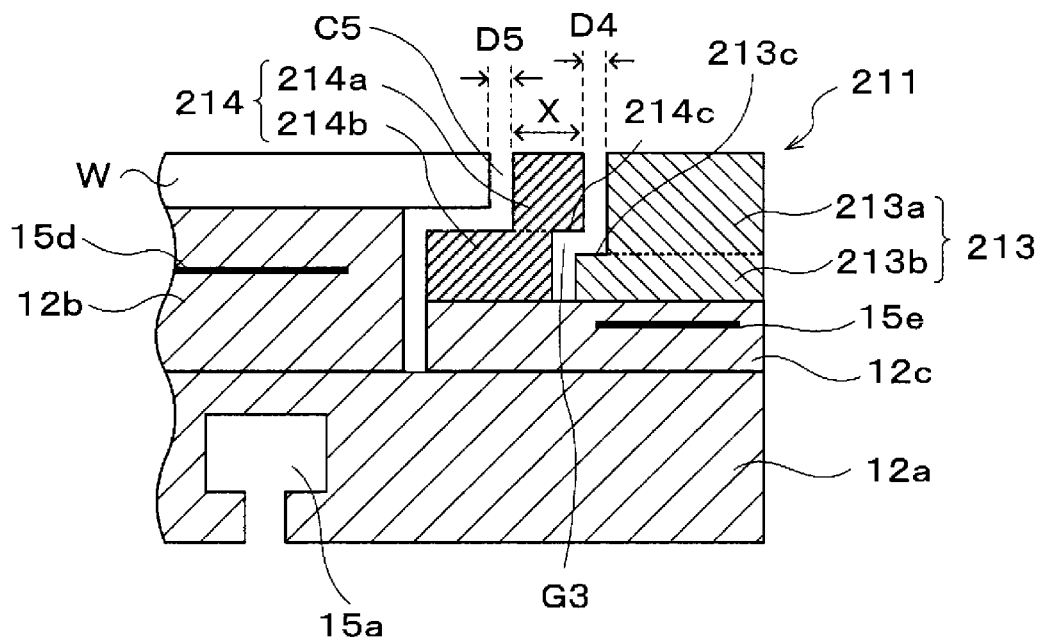
FIG. 5 is an enlarged view of a main part schematically illustrating the outline of the configuration of a stage according to a third embodiment.

Subsequently, the configuration of a stage 211 according to a third embodiment will be described with reference to FIG. 5. FIG. 5 is an enlarged view of a main part schematically illustrating the outline of the configuration of the stage 211 according to the third embodiment.

A focus ring 213 according to the present embodiment has a configuration in which an upper ring portion 213a and a lower ring portion 213b are provided integrally, as illustrated in FIG. 5. The upper ring portion 213a and the lower ring portion 213b have annular shapes having different inner diameters. Specifically, the inner diameter of the upper ring portion 213a is larger than the inner diameter of the lower ring portion 213b, and the lower ring portion 113a protrudes radially inward at the outer peripheral portion of the focus ring 213. The upper ring portion 213a and the lower ring portion 213b form a lower end portion 213c. Further, the outer diameters of the upper ring portion 213a and the lower ring portion 213b are substantially the same. Further, the upper surface of the upper ring portion 213a is configured to substantially coincide with the upper surface of the wafer W placed on the wafer holder 12b.

A deposit control ring 214 is provided on the upper surface of the ring holder 12c and radially inside the focus ring 213. The deposit control ring 214 is fixed to the ring holder 12c via, for example, an adhesive.

The deposit control ring 214 has a configuration in which an upper ring portion 214a and a lower ring portion 214b are provided integrally. The upper ring portion 214a and the lower ring portion 214b have annular shapes having different inner diameters. Specifically, the outer diameter of the upper ring portion 214a is smaller than the outer diameter of the lower ring portion 214b, and the upper ring portion 113a protrudes radially outward at the outer peripheral portion of the deposit control ring 214. The upper ring portion 214a and the lower ring portion 214b form an upper end portion 214c. The inner diameter of the lower ring portion 214b is smaller than the inner diameter of the upper ring portion 214a. Further, the upper surface of the upper ring portion 214a is configured to substantially coincide with the upper surface of the wafer W placed on the wafer holder 12b and the upper surface of the upper ring portion 213a of the focus ring 213.

The outer diameter of the upper ring portion 214a of the deposit control ring 214 is smaller than the inner diameter of the upper ring portion 213a of the focus ring 213. A gap G3 is formed between the focus ring 213 and the deposit control ring 214 in the radial direction. The gap G3 has a labyrinth structure by the lower end portion 213c of the focus ring 213 and the upper end portion 214c of the deposit control ring 214. The gap G3 may prevent plasma from reaching the ring holder 12c. As a result, damage to the ring holder 12c due to plasma may be suppressed.

In the gap G3, an interval D4 between the upper surface of the upper ring portion 213a and the upper surface of the upper ring portion 214a is preferably larger than 0 mm and equal to or less than 1 mm. In such a case, it is possible to suppress the plasma from entering the gap G3.

In addition, the inner diameter of the upper ring portion 214a of the deposit control ring 214 is larger than the outer diameter of the wafer W, and a clearance C5 is provided. In the present embodiment, an interval D5 of the clearance C5 is preferably, for example, larger than 0 mm and equal to or less than 1 mm. Also, in the present embodiment, the focus ring 213 and the deposit control ring 214 are separated. Further, since the interval D5 of the clearance C5 is 1 mm or less, it is possible to appropriately suppress the adhesion of the deposit on the deposit control ring 14 and the wafer holder 12b due to the plasma wrapping around from the outer peripheral portion of the wafer W as in the first and second embodiments.

In the present embodiment, the upper surface of the upper ring portion 214a of the deposit control ring 214 is exposed to the processing space S, that is, is exposed to plasma, so that the temperature of the deposit control ring 214 is controlled and maintained at a higher temperature. Thus, it is possible to further suppress plasma from wrapping around downward from the outer peripheral portion of the wafer W.

By increasing the exposed area of the upper ring portion 214a to plasma, that is, by increasing an exposed portion X, the temperature of the deposit control ring 214 may be further increased. However, by increasing the size of the exposed portion X, since the exposed area of the focus ring 213 which controls the distribution of the Si scavenging function and the etchant distribution is reduced, it is necessary to set the area of the exposed portion X in consideration of these balances. In the present embodiment, the outer diameter of the exposed portion X is 300 mm to 360 mm. A more preferable range of the outer diameter of the exposed portion X is 305 mm to 340 mm.

Other Embodiments

As described above, in the first to third embodiments, the shapes of the focus rings 13, 113, and 213 and the deposit control rings 14, 114, and 214 are appropriately modified. In addition, the shape of the base 12 may be changed as appropriate.

For example, the base 12 of the first embodiment is configured by providing a wafer holder 12b and a ring holder 12c above a base body 12a, and providing a focus ring 13 and a deposit control ring 14 on the upper surface of the ring holder 12c.

Figure 6:
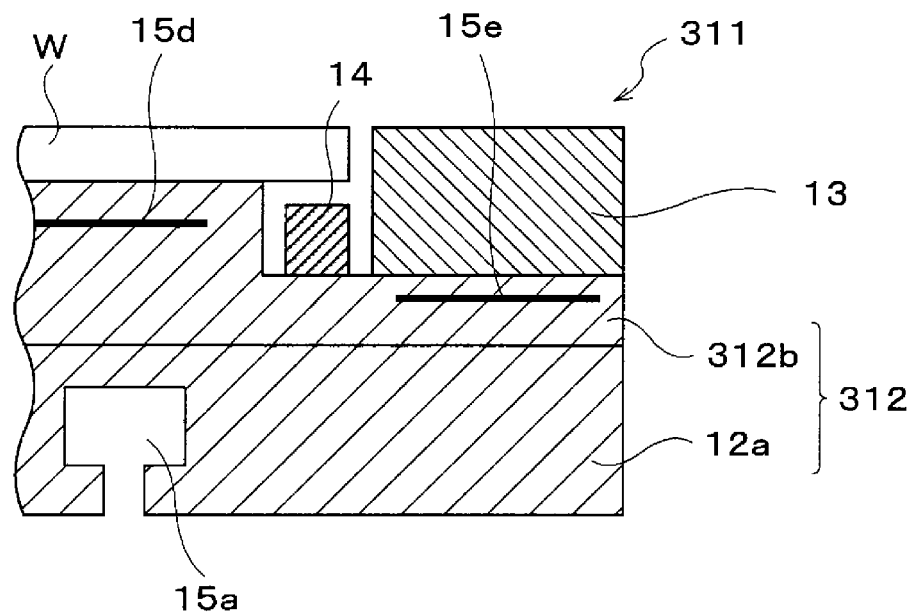
FIG. 6 is an explanatory diagram illustrating a first modification of a base according to the present embodiment.

Like a stage 311 illustrated in FIG. 6, the base 312 may have a base body 12a and a holder 312b. The holder 312b is provided above the base body 12a and has a configuration in which a wafer holder and a ring holder are integrated. With this configuration, the number of components constituting the stage 311 may be reduced as compared with the stage 11, and the structure may be simplified.

Figure 7:
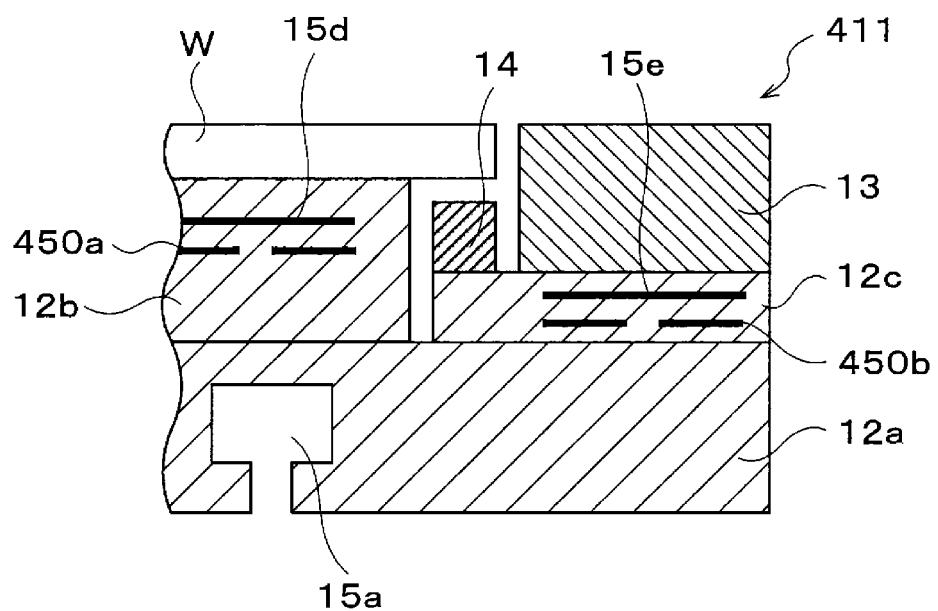
FIG. 7 is an explanatory diagram illustrating a second modification of the base according to the present embodiment.

Also, as illustrated in FIG. 7, in the stage 411, a first heater 450a that heats the wafer W may be provided below the first adsorption electrode 15d inside the wafer holder 12b. A second heater 450b that heats the focus ring 13 may be provided inside the ring holder 12c below the second adsorption electrode 15e. In addition, only one of the first heater 450a and the second heater 450b may be provided. With this configuration, the temperature adjustment of the wafer W and the focus ring 13 may be separated from each other and a precise temperature adjustment may be performed.

Figure 8:
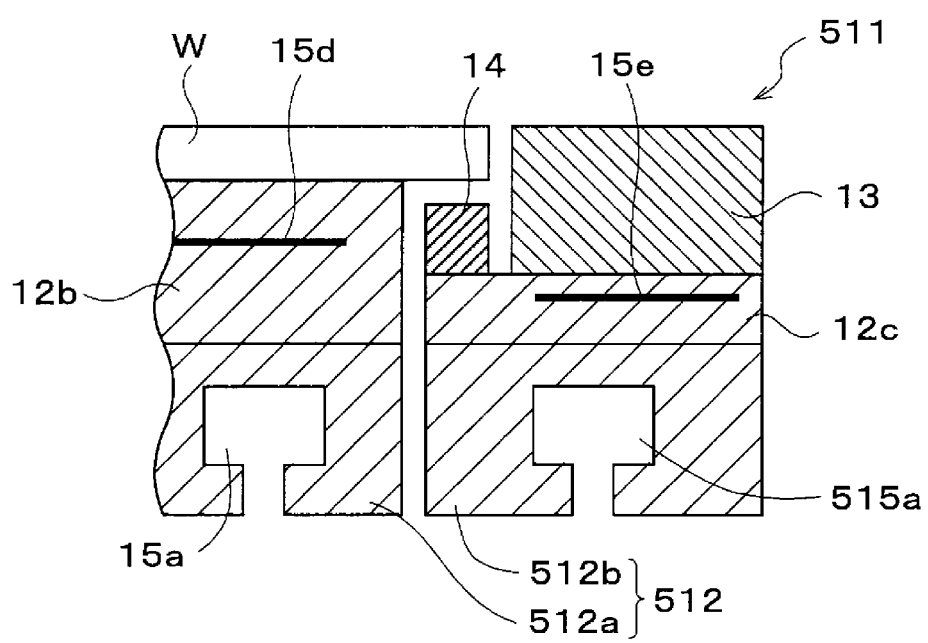
FIG. 8 is an explanatory diagram illustrating a third modification of the base according to the present embodiment.

Further, in the stage 511 illustrated in FIG. 8, the base 512 may be configured by being divided into a central base 512a that holds the wafer holder 12b and an outer peripheral holder 512b that holds the ring holder 12c. With this configuration, the temperature may be controlled by separating the wafer holder 12b and the ring holder 12c into separate systems. That is, it is possible to control the temperature by causing a coolant of another temperature to flow through the coolant flow path 15a and a coolant flow path 515a, and it is possible to more precisely adjust the temperature of the wafer W and the focus ring 13.

In the above embodiment, the stage for electrostatically adsorbing the wafer and the focus ring has been described as an example. However, the principle according to the present disclosure, that is, a stage structure for separating the focus ring and the deposit control ring may be applied to various existing electrostatic chuck models.

Further, the above-described plasma processing apparatus 1 has been described by taking a capacitively-coupled plasma processing apparatus as an example. However, for example, any type of plasma processing apparatus may be used, such as an inductively coupled plasma processing apparatus or a plasma processing apparatus that excites a gas with a surface wave such as a microwave.

The embodiments disclosed this time are to be considered in all respects as illustrative and not restrictive. The embodiments described above may be omitted, substituted, or changed in various forms without departing from the scope of the appended claims and the subject matter thereof.

The following configurations also fall within the technical scope of the present disclosure.

(1) A stage on which a substrate is disposed, including:
a base including an adsorption electrode therein;
a focus ring provided above the adsorption electrode and adsorbed and held on the base; and
a deposit control ring provided radially inside the focus ring on the base,
wherein a gap is formed between the focus ring and the deposit control ring in a radial direction to separate the focus ring and the deposit control ring.

According to (1), the temperature control of the focus ring and the deposit control ring may be independently performed. As a result, since the temperature of the deposit control ring may be kept higher than the inner peripheral portion of the focus ring, it is possible to suppress the adhesion of plasma on the inner peripheral portion of the deposit control ring and the side wall of the base by the plasma wrapping around from the outer peripheral portion of the substrate.

(2) The stage described in (1), wherein the gap extends in a vertical direction.

According to (2), since the shape of the gap is simple, the stage may be easily manufactured.

(3) The stage described in (1), wherein an upper end portion is formed on an outer peripheral portion of the focus ring such that an upper surface side of the focus ring projects radially inward,
a lower end portion is formed on an outer peripheral portion of the deposit control ring such that a lower surface side of the deposit control ring projects radially outward, and
the gap has a labyrinth structure formed by the upper end portion and the lower end portion.

According to (3), since the gap has a labyrinth structure, it is possible to suppress plasma from reaching the base, and as a result, it is possible to suppress damage to the base due to the plasma.

(4) The stage described in (2) or (3), wherein an inner diameter of the upper surface of the focus ring is larger than an outer diameter of the substrate disposed on the base, and
an interval between an inner peripheral surface on the upper surface side of the focus ring and an outer peripheral surface of the substrate is larger than 0 mm and equal to or less than 1 mm.

According to (4), by setting the size of the gap to 1 mm or less, it is possible to suppress the intrusion of plasma from the gap. As a result, it is possible to reduce the amount of plasma penetrating below the substrate, and it is possible to more appropriately suppress the adhesion of the deposit on the inner peripheral portion of the deposit control ring and the side wall of the base by the plasma wrapping around from the outer peripheral portion of the substrate.

(5) The stage described in (1), wherein a lower end portion is formed on an outer peripheral portion of the focus ring such that a lower surface side of the focus ring projects radially inward,
an upper end portion is formed on an outer peripheral portion of the deposit control ring such that an upper surface side of the deposit control ring projects radially outward, and the gap has a labyrinth structure formed by the lower end portion and the upper end portion.

According to (5), since the gap has a labyrinth structure, it is possible to suppress plasma from reaching the base, and as a result, it is possible to suppress damage to the base due to the plasma.

(6) The stage described in (5), wherein an inner diameter of an upper surface of the deposit control ring is larger than an outer diameter of the substrate disposed on the base, and an interval between an inner peripheral surface on an upper surface side of the focus ring and an outer peripheral surface of the substrate is larger than 0 mm and equal to or less than 1 mm.

According to (6), by setting the size of the gap to 1 mm or less, it is possible to suppress the intrusion of plasma from the gap. That is, it is possible to reduce the amount of plasma penetrating below the substrate, and it is possible to more appropriately suppress the adhesion of the deposit on the inner peripheral portion of the deposit control ring and the side wall of the base by the plasma wrapping around from the outer peripheral portion of the substrate.

(7) The stage described in any one of (1) to (6), wherein an inner diameter of the focus ring is smaller than an inner diameter of the adsorption electrode, and a difference between the inner diameter of the focus ring and the inner diameter of the adsorption electrode is larger than 0 mm and equal to or less than 10 mm.

According to (7), since the adsorption electrode is located only below the focus ring and is not disposed below the deposit control ring, the deposit control ring is not cooled, and the inner temperature of the focus ring may be kept high. As a result, it is possible to appropriately suppress the adhesion of the deposit on the inner peripheral portion of the deposit control ring and the side wall of the base.

(8) The stage described in any one of (1) to (7), wherein an outer diameter of the deposit control ring is 300 mm to 360 mm.

According to (8), since the temperature of the deposit control ring may be appropriately raised, it is possible to appropriately suppress the adhesion of the deposit on the inner peripheral portion of the deposit control ring and the side wall of the base.

(9) The stage described in any one of (1) to (8), wherein a material of the deposit control ring is different from a material of the focus ring and selected from a brittle material or a resin material.

According to (9), the material of the deposit control ring may be arbitrarily selected according to the processing procedures, and the degree of freedom in material selection is increased.

(10) The stage described in any one of (1) to (9), wherein at least a contact surface of the deposit control ring or a contact surface of the base is surface-treated such that a contact thermal resistance between the deposit control ring and the base becomes larger than a contact thermal resistance between the focus ring and the base.

According to (10), the thermal resistance between the deposit control ring and the base may be increased, and the deposit control ring may be kept at a high temperature with respect to the inner peripheral portion of the focus ring.

(11) The stage described in any one of (1) to (9), wherein a thermal resistance layer having a heat insulating property is formed between the deposit control ring and the base.

(12) The stage described in (11), wherein the thermal resistance layer is a heat insulating coating formed on at least a contact surface of the deposit control ring or a contact surface of the base.

(13) The stage described in (11), wherein the thermal resistance layer is a heat insulating member provided between the deposit control ring and the base.

According to (11) to (13), the same effect as described in (10) may be exhibited.

(14) The stage described in any one of (1) to (13), further including a heater configured to heat the substrate disposed on at least the focus ring or the base.

According to (14), the temperature of the stage may be more appropriately controlled, and the plasma processing in the plasma processing apparatus may be more appropriately performed.

(15) The stage described in any one of (1) to (14), wherein the base includes:

a base body;

a substrate holder provided on the base body; and a ring holder provided radially outside the substrate holder on the base body, and the focus ring and the deposit control ring are held on the ring holder.

According to (15), it is suggested that the base further includes a substrate holder and a ring holder, and that the temperature of the substrate, the focus ring, and the deposit control ring are controlled independently.

(16) The stage described in (15), wherein the substrate holder and the ring holder are integrally constructed.

According to (16), the number of components constituting the stage may be reduced, that is, the configuration of the stage may be further simplified.

(17) The stage described in any one of (1) to (14), wherein the base includes:

a base body;

a substrate holder provided on the base body; and a ring holder provided radially outside the substrate holder on the base body, and the focus ring is held on the ring holder, and the deposit control ring is provided radially inside the ring holder on the base body.

According to (17), the life of the components of the deposit control ring and the ring holding portion may be extended. In addition, since the temperature control of the ring holder and the substrate holder may be performed independently, the temperature control of the stage may be performed more appropriately.

(18) A plasma processing apparatus including:

a processing container that defines a processing space in which plasma is generated; and a stage on which a substrate is disposed inside the processing container, wherein the stage includes:

a base embedded with an adsorption electrode inside;

a focus ring provided above the adsorption electrode and adsorbed and held on the base; and a deposit control ring provided radially inside the focus ring on the base, and a gap is formed between the focus ring and the deposit control ring in a radial direction to separate the focus ring and the deposit control ring.

According to (18), the stage described in (1) to (17) may be adopted in any plasma processing apparatus.

DESCRIPTION OF SYMBOLS

11: stage
12: base
13: focus ring
14: deposit control ring

15e: second adsorption electrode
W: wafer

What is claimed is:

1. A stage on which a substrate is disposed, comprising:
a base embedded with an adsorption electrode therein;
a focus ring provided above the adsorption electrode and adsorbed and held on the base; and
a deposit control ring provided radially inside the focus ring on the base,
wherein a gap is formed between the focus ring and the deposit control ring in a radial direction to separate the focus ring and the deposit control ring, and
at least a contact surface of the deposit control ring or a contact surface of the base is surface-treated such that a contact thermal resistance between the deposit control ring and the base becomes larger than a contact thermal resistance between the focus ring and the base.

2. The stage according to claim 1, wherein the gap extends in a vertical direction.

3. The stage according to claim 1, wherein an upper end portion is formed on an outer peripheral portion of the focus ring such that an upper surface side of the focus ring projects radially inward,
a lower end portion is formed on an outer peripheral portion of the deposit control ring such that a lower surface side of the deposit control ring projects radially outward, and
the gap has a labyrinth structure formed by the upper end portion and the lower end portion.

4. The stage according to claim 2, wherein an inner diameter of the upper surface of the focus ring is larger than an outer diameter of the substrate disposed on the base, and
an interval between an inner peripheral surface on the upper surface side of the focus ring and an outer peripheral surface of the substrate is larger than 0 mm and equal to or less than 1 mm.

5. The stage according to claim 1, wherein a lower end portion is formed on an outer peripheral portion of the focus ring such that a lower surface side of the focus ring projects radially inward,
an upper end portion is formed on an outer peripheral portion of the deposit control ring such that an upper surface side of the deposit control ring projects radially outward, and
the gap has a labyrinth structure formed by the lower end portion and the upper end portion.

6. The stage according to claim 5, wherein an inner diameter of an upper surface of the deposit control ring is larger than an outer diameter of the substrate disposed on the base, and
an interval between an inner peripheral surface on an upper surface side of the focus ring and an outer peripheral surface of the substrate is larger than 0 mm and equal to or less than 1 mm.

7. The stage according to claim 1, wherein an inner diameter of the focus ring is smaller than an inner diameter of the adsorption electrode, and
a difference between the inner diameter of the focus ring and the inner diameter of the adsorption electrode is larger than 0 mm and equal to or less than 10 mm.

8. The stage according to claim 1, wherein an outer diameter of the deposit control ring is 300 mm to 360 mm.

9. The stage according to claim 1, wherein a material of the deposit control ring is different from a material of the focus ring and selected from a brittle material or a resin material.

10. The stage according to claim 1, wherein the base includes:
a base body;
a substrate holder provided on the base body; and
a ring holder provided radially outside the substrate holder on the base body, wherein the focus ring is held on the ring holder, and
the deposit control ring is provided radially inside the ring holder on the base body.

11. The stage according to claim 1, wherein a thermal resistance layer having a heat insulating property is formed between the deposit control ring and the base.

12. The stage according to claim 11, wherein the thermal resistance layer is a heat insulating coating formed on at least a contact surface of the deposit control ring or a contact surface of the base.

13. The stage according to claim 11, wherein the thermal resistance layer is a heat insulating member provided between the deposit control ring and the base.

14. The stage according to claim 1, further comprising a heater configured to heat the substrate disposed on at least the focus ring or the base.

15. The stage according to claim 1, wherein the base includes:
a base body;
a substrate holder provided on the base body; and
a ring holder provided radially outside the substrate holder on the base body, and wherein the focus ring and the deposit control ring are held on the ring holder.

16. The stage according to claim 15, wherein the substrate holder and the ring holder are integrally constructed.

17. A plasma processing apparatus comprising:
a processing container that defines a processing space in which plasma is generated; and
a stage on which a substrate is disposed inside the processing container,
wherein the stage includes:
a base embedded with an adsorption electrode therein;
a focus ring provided above the adsorption electrode and adsorbed and held on the base; and
a deposit control ring provided radially inside the focus ring on the base, and
wherein a gap is formed between the focus ring and the deposit control ring in a radial direction to separate the focus ring and the deposit control ring.

* * * * *